United States Patent
Papadopoulou et al.

(10) Patent No.: US 7,685,553 B2
(45) Date of Patent: Mar. 23, 2010

(54) SYSTEM AND METHOD FOR GLOBAL CIRCUIT ROUTING INCORPORATING ESTIMATION OF CRITICAL AREA ESTIMATE METRICS

(75) Inventors: Evanthia Papadopoulou, Baldwin Place, NY (US); Ruchir Puri, Baldwin Place, NY (US); Mervyn Y. Tan, Hopewell Junction, NY (US); Louise H. Trevillyan, Katonah, NY (US); Hua Xiang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 11/733,795

(22) Filed: Apr. 11, 2007

(65) Prior Publication Data

US 2008/0256502 A1    Oct. 16, 2008

(51) Int. Cl.
*G06F 17/50* (2006.01)
(52) U.S. Cl. .................. 716/13; 716/4; 716/7; 716/10; 716/12; 716/14; 703/1; 703/14
(58) Field of Classification Search .................... 716/4, 716/7, 10, 12, 13, 14

See application file for complete search history.

(56) References Cited

U.S. PATENT DOCUMENTS

| | | | | |
|---|---|---|---|---|
| 6,230,304 | B1 * | 5/2001 | Groeneveld et al. | 716/7 |
| 6,289,495 | B1 * | 9/2001 | Raspopovic et al. | 716/12 |
| 6,493,658 | B1 * | 12/2002 | Koford et al. | 703/1 |
| 6,665,852 | B2 * | 12/2003 | Xing et al. | 716/12 |
| 7,062,743 | B2 * | 6/2006 | Kahng et al. | 716/13 |
| 7,139,992 | B2 * | 11/2006 | Xing et al. | 716/12 |
| 7,512,921 | B2 * | 3/2009 | Shibuya | 716/9 |
| 2002/0100009 | A1 * | 7/2002 | Xing et al. | 716/12 |
| 2002/0104061 | A1 * | 8/2002 | Xing et al. | 716/4 |
| 2002/0107711 | A1 * | 8/2002 | Xing et al. | 705/7 |
| 2008/0216040 | A1 * | 9/2008 | Furnish et al. | 716/10 |

\* cited by examiner

*Primary Examiner*—Helen Rossoshek
(74) *Attorney, Agent, or Firm*—Jeffrey N. Giunta; Fleit, Gibbons, Gutman, Bongini & Bianco P.L.

(57) ABSTRACT

An electronic circuit layout refinement method and system. A grid of equally sized tiles is defined on a circuit layout area. Each tile of the grid has a respective critical area estimate metric associated with critical area estimates for a circuit to be placed on the circuit layout area. A global circuit routing for a circuit to be placed within a plurality of tiles of the grid is performed. An estimation of critical area estimate metrics that are assigned to respective tiles of the grid is performed prior to performing a detailed circuit routing for the circuit. The global circuit routing is adjusted, after estimating the critical area estimate metrics, in order to improve a respective critical area estimate metric assigned to at least one tile of the grid. The adjusted global circuit routing is then produced.

34 Claims, 4 Drawing Sheets

SYSTEM AND METHOD FOR GLOBAL CIRCUIT ROUTING INCORPORATING ESTIMATION OF CRITICAL AREA ESTIMATE METRICS

FIELD OF THE INVENTION

The present invention relates generally to systems and methods for designing electronic circuits and more particularly to circuit trace layout systems and methods.

BACKGROUND OF THE INVENTION

Incorporating yield prediction into the design and layout of integrated circuit components allows more efficient design and production of integrated circuits. State-of-the-Art Critical Area Analysis (CAA) is typically used in performing yield estimations for an integrated circuit design. The ever increasing manufacturing costs associated with the ever decreasing component sizes in the deep-submicron semiconductor arena have increased the impact of effective yield prediction in improving the economy of efficient integrated circuit production.

The critical area of an integrated circuit design is the expected area of a chip that is lost to random substrate and/or circuit defects. Such random substrate and/or circuit defects on an integrated circuit die prevent the proper formation of, for example, a conductive trace of a circuit and thereby causes the failure of one or more integrated circuits formed on an integrated circuit die. A critical area reflects the sensitivity of a circuit design and layout to spot defects occurring during chip fabrication. Examples of spot defects are substrate and/or circuit defects caused by particles, such as dust and other contaminants. Spot defects in an integrated circuit component can lead to conductive trace shorts, opens, or problems related to blockage of inter-layer vias.

Spot defects analyzed by critical area analyses include inter-conductor short spot defects, intra-conductor open spot defects, defects causing blockages of inter-layer vias, and defects causing combination faults. An inter-conductor short spot defect is a spot defect that causes a conductive short between two conductors of a circuit. The susceptibility of a circuit to failure due to inter-conductor short spot defects varies inversely with inter-conductor spacing and varies in concert with the length of conductors that are close to one another since smaller defects will affect adjacent conductors that are closer to each other and conductors that are close to each other for longer lengths are more likely to encounter a spot defect.

Intra-conductor open spot defects are spot defects that create a non-conductive area on a circuit that can interfere with the creation of a conductive trace. The susceptibility of a circuit to failure due to intra-conductor open spot defects varies in concert with conductor length and varies inversely to conductor width. Longer conductors are more likely to encounter an intra-conductor open defect and wider conductors are more likely to be wider than an encountered defect and therefore still be conductive.

The calculation of a critical area for a particular integrated circuit design requires a definition of the detail metal shapes that are to be used in the integrated circuit. Critical area analysis is computationally expensive and time consuming. Therefore, critical area analysis is usually applied in the later or post-design stages for chip evaluation. However, designs are almost fixed in those late design stages and only simple local changes can be applied. Although local tuning can help to improve the layout, the compensation ability is strictly constrained by the existing design.

Therefore a need exists to overcome the problems with the prior art as discussed above.

SUMMARY OF THE INVENTION

In accordance with one aspect of the present invention, a method for determining a circuit layout includes defining a grid of tiles on a circuit layout area where each tile of the grid has a respective associated critical area estimate metric. The method further includes performing a global circuit routing for a circuit to be placed within a plurality of tiles of the grid and estimating for at least one tile of the grid, prior to determining a detailed circuit routing for the circuit, a respective critical area estimate metric. The method also includes adjusting the global circuit routing, after estimating the critical area estimate metrics, to improve a selected respective critical area estimate metric assigned to at least one tile of the grid to create an adjusted global circuit routing. The method further includes producing an adjusted global circuit routing.

In accordance with another aspect of the present invention, a circuit layout definition system include a netlist storage area adapted to store at least one netlist of a circuit and a grid definition processor that is adapted to define a grid of tiles on a circuit layout area. Each tile of the grid has a respective associated critical area estimate metric. The circuit layout definition system further includes a global circuit routing processor that performs a global circuit routing for the circuit that is to be placed within a plurality of tiles of the grid. The circuit layout definition system also includes a critical area metric estimator that estimates for at least one tile of the grid, prior to a determining of a detailed circuit routing for the circuit, a respective critical area estimate metric. The circuit layout definition system further includes a global circuit routing adjustment processor adapted to produce a critical area adjusted global circuit routing by adjusting the global circuit routing, after estimating the critical area estimate metrics, to improve a selected respective critical area estimate metric assigned to at least one tile of the grid.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
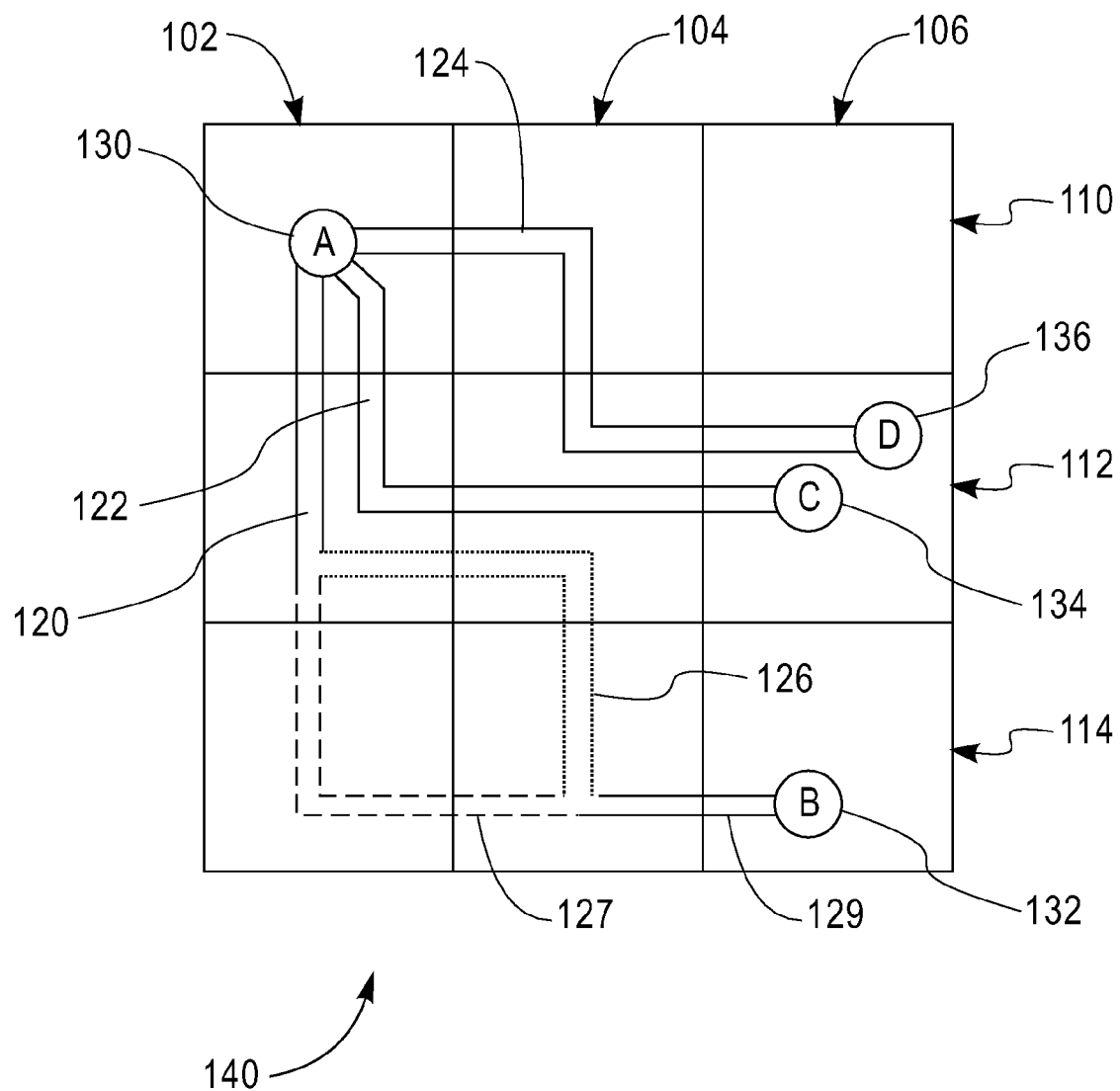
FIG. 1 illustrates a circuit layout area divided into a grid of tiles and with several example conductive traces, in accordance with an embodiment of the present invention.

While the specification concludes with claims defining the features of the invention that are regarded as novel, it is believed that the invention will be better understood from a consideration of the following description in conjunction with the drawing figures, in which like reference numerals are carried forward.

One embodiment of the present invention provides refined global routing of a circuit layout to improve expected yields of an integrated circuit's design. The global routing of the circuit is refined so as to reduce the susceptibility of the circuit design to spot defects in a manufactured integrated circuit. The global routing is analyzed to estimate metrics for the global routing that are associated with the susceptibility of that global routing to spot defects. One embodiment of the present invention determines metrics that are estimates of metrics related to a critical area analysis for a given global circuit routing. These estimated metrics that are related to critical area analysis for the circuit are referred to herein as critical area estimate metrics. Tiles with higher critical area estimate metrics are assumed to be more susceptible to being rendered unusable due to the random occurrence of spot defects within those tiles when the circuit is manufactured. One embodiment of the present invention iteratively adjusts the global routing to improve those metrics. Once a refined global routing is produced, the produced global routing is provided to a detailed routing processor to perform detailed routing of the circuit.

One embodiment of the present invention divides a circuit layout area into a grid of tiles. The global routing is then superimposed on the grid of tiles. The estimation of one or more critical area estimate metrics that are assigned to each tile of the grid of tiles is then performed by calculating metrics based upon all of the conductive traces that are within each tile area, such as the total perimeter of conductive traces within each respective tile or the total trace length of traces within each respective tile. Further embodiments are able to use other metrics as is described below. It is to be noted that calculating critical area estimate metrics is performed for the conductive traces contained within the respective tiles. For example, determining the conductive trace perimeter for a particular tile involves determining the trace perimeter for the portion of each trace that is within each tile and does not include areas of those traces that are outside of that particular tile.

Once the critical area estimate metrics for each tile are estimated, the global routing of one embodiment is then iteratively adjusted to improve the metrics of selected tiles, such as tiles that have higher metrics that indicate that the conductive traces within those tiles are more susceptible to spot defects. Estimating the critical area estimate metrics during the global routing phase, and prior to performing detailed circuit routing, allows more effective routing adjustments since the conductive trace routing is less defined during the global routing phase. The less defined structure of the conductive trace routing allows larger scale changes to be made to the conductive trace routing during the global routing phase. Furthermore, estimating critical area estimate metrics during global routing consumes less computing resources and thereby executes in far less time than when performed during detailed routing. Estimating critical area estimate metrics during global routing and adjusting the global routing to improve the critical area estimate metrics allows practical implementation of iterative rerouting to reduce a circuit layout's susceptibility to spot defects and thereby improves the manufacturing yield of a particular circuit.

FIG. 1 illustrates a circuit layout area 100 that is divided into a grid of tiles 140 and with several example conductive traces, in accordance with an embodiment of the present invention. The circuit layout area 100 of one embodiment is a two dimensional physical area onto which a circuit is to be placed. In one embodiment, the circuit layout area 100 represents a surface of a monolithic semiconductor integrated circuit substrate containing circuit components and onto which conducting traces to connect those circuit components will be placed. One embodiment of the present invention determines a routing of the conducting traces to be incorporated in the monolithic semiconductor integrated circuit to properly connect the circuit components of that circuit.

A logic circuit design generally includes a list of conductive interconnections between connections of circuit components. Each conductive interconnection is able to electrically connect two or more circuit components, such as input connections or output connections for logic gates or other circuit components. Each of these conductive interconnections is often referred to as a "net" and an integrated circuit is able to include any number of nets from a few nets to many thousands of nets or even more. The complete set of nets that make up a circuit is referred to as a "netlist."

The circuit layout area 100 of this example has four component connections that are identified as connector A 130, connector B 132, connector C 134 and connector D 136. This description uses a circuit layout area that is small and simple in order to provide a simpler and easier to understand description of the present invention. It is clear that the processing described herein is able to operate in conjunction with electronic circuits that have any number of conductive traces, component connections, circuit paths and/or netlists.

The circuit layout area 100 of this example is divided into a number of uniform area tiles, or smaller sub-units of the circuit layout area 100. The circuit layout area 100 of this example is divided into a three-by-three grid of tiles 140 that divides the two dimensional circuit layout area into a number of tiles. The estimation of critical area estimate metrics for each tile of one embodiment of the present invention is based upon parameters of the conductive traces that are in each of those tiles. One embodiment uses the critical area estimate metrics for each tile to refine a global layout of a particular circuit to reduce the likelihood that semiconductor defects will damage that circuit on a semiconductor substrate. This description uses a three-by-three grid of tiles 140 to simplify the description of the operation of one embodiment of the present invention. Various embodiments of the present invention are able to operate by dividing a circuit layout area into any practical number of tiles. In one embodiment, these tiles have uniform size. Further embodiments of the present invention are able to incorporate tiles of varying sizes.

The grid of tiles 140 divides the circuit layout area into tiles that are arranged in uniform rows and columns. The grid of tiles 140 has a first row of tiles 110, a second row of tiles 112 and a third row of tiles 114. The grid of tiles 140 also has a first column of tiles 102, a second column of tiles 104 and a third column of tiles 106. Further embodiments are able to divide a circuit layout area into an asymmetrical grid that is also able to have equal or unequal numbers of rows and columns.

The circuit layout area 100 shows an electrical circuit where connector A 130 is connected to the other three connections: connector B 132, connector C 134, and connector D 136, by conductive traces to form an electrical circuit. Connector A 130 is connected to connector B 132 by a first conductive circuit trace that consists of an initial trace 120, one of two alternative traces—first alternative trace 126 or second alternative trace 127—and a final trace 129. Connector A 130 is further connected to connector C 134 by a second conductive circuit trace 122 and also to connector D 136 by a third conductive circuit trace 124.

The illustrated circuit layout area 100 depicts two alternative conductive trace routes to connect connector A 130 to connector B 132. The initial part of the conductive trace consists of the initial trace 120. Two alternative paths are illustrated to complete the connection between the end of the initial trace 120 and a beginning of the final trace 129 to finally form the conductive connection to connector B 132.

The first alternative trace 126 is illustrated as connecting to the initial trace 120 at the second row 112 and the first column 102 of the grid of tiles 140 and passing through the tile at the second row 112 and the second column 104 to connect to the final trace 129 in the third row 114 and second column 104 of grid of tiles 140. The second alternative trace 127 is illustrated as connecting to the initial trace 120 at the second row 112 and the first column 102 of grid of tiles 140 and passing through the tile at the third row 114 and the first column 102 to connect to the final trace 129 in the third row 114 and second column 104 of grid of tiles 140.

It is clear that selection of either the first alternative trace 126 or the second alternative trace 127 will provide a conductive path between connector A 130 and connector B 132. Selecting the first alternative trace, however, will result in having a higher concentration of conductive traces in the tile at the second row 112 and the second column 104 of grid of grid of tiles 140. Having this higher concentration of conductive traces in this one tile increases the susceptibility of the layout to a circuit fault caused by a spot defect that is located in that tile. Selection of the second alternative trace 127 results in a lower concentration of conductive traces in the tile at the second row 112 and the second column 104 and thereby reduces the susceptibility of the layout to a circuit fault in that tile and improves the yield of circuits produced with a circuit layout choosing the second alternative trace 127 over the first alternative trace 126. These susceptibilities are reflected in the critical area estimate metrics that are estimated for these two alternative routings. Comparing the critical area estimate metrics for these two alternative routings allows the less susceptible routing, the routing including the second alternative route 127, to be identified and selected for the final global routing.

As is described below, one embodiment of the present invention estimates critical area estimate metrics for each tile based upon a global routing of a circuit and selects alternate routes, such as the first alternate route 126 or the second alternate route 127, to refine global routing for a particular circuit layout to improve the critical area estimate metrics and increase circuit yield. Since the first alternative trace 126 places a higher conductive trace concentration in the tile located at the second row 112 and second column 104 as compared to the second alternative trace 127, the second alternative trace 127 is preferred for this particular scenario. A first global circuit routing that includes the first alternative route 126 that is processed by one embodiment of the present invention results in estimating that the tile located at the second row 112 and second column 104 has a high critical area estimate metric. One embodiment of the present invention identifies tiles with high critical area estimate metrics and operates to re-route conductive traces that pass through that tile to reduce the critical area estimate metric for those tiles. In the above example, the conductive trace between connector A 130 and connector B 132 is re-routed to replace the first alternative route 126 with, for example, the second alternative route 127. The re-routing of that conductive trace reduces the critical area estimate metric for the tile at the second row 112 and second column 104 and, in this example, does not result in increasing the critical area estimate metric for any other tile to an unacceptably high level.

Figure 2:
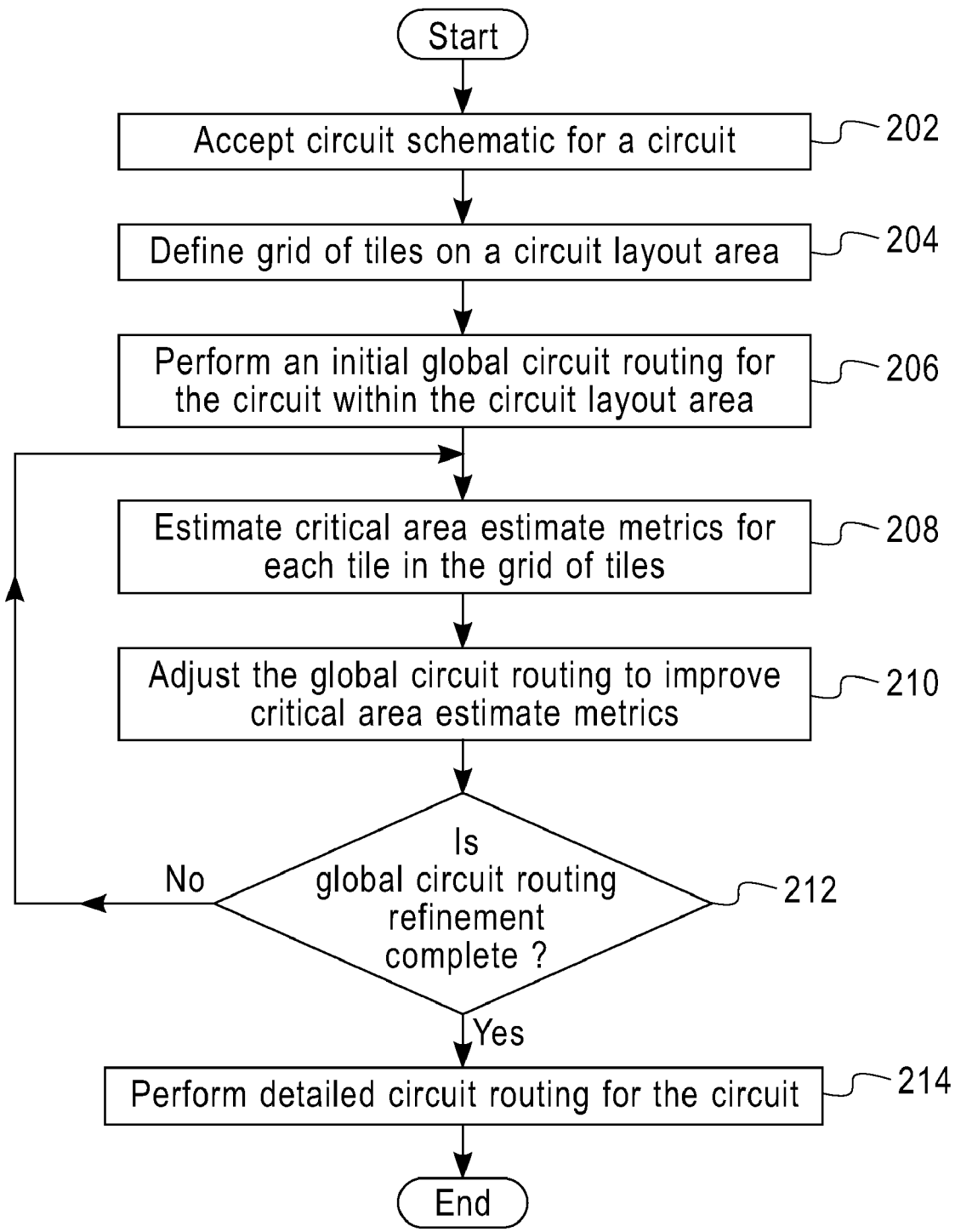
FIG. 2 is a processing flow diagram illustrating a circuit routing refinement process incorporating estimation of critical area estimate metrics during global routing, in accordance with an embodiment of the present invention.

FIG. 2 is a processing flow diagram illustrating a circuit routing refinement process 200 that incorporates estimation of critical area estimate metrics during global routing, in accordance with an embodiment of the present invention. The global routing refinement process 200 begins by accepting, at step 202, a circuit schematic for a circuit. Circuit schematics are able to be developed by any suitable method. A circuit schematic accepted by one embodiment of the present invention includes a specification of the netlists of the circuit, which define the interconnections between various circuit component connections.

The global routing refinement process 200 proceeds by defining, at step 204, a grid of tiles on a circuit layout area. One example of such a grid of tiles is the three-by-three grid of tiles 140 illustrated as being defined for the circuit layout area 100. The processing continues by performing, at step 206, an initial global circuit routing for the circuit within the circuit layout area.

Once an initial global circuit routing is determined for the circuit, the global routing refinement process 200 estimates, as step 208, a critical area estimate metric for each tile in the grid of tiles. Examples of critical area estimate metrics that are determined for each tile are described in detail below and include, for example, the total trace perimeter or the total linear length of all of the conductive traces, which are also referred to as nets, that are contained within each respective tile. Other critical area estimate metrics are also able to be used by further embodiments of the present invention, including, but not limited to, those described in more detail below.

The global routing refinement process 200 next adjusts, at step 210, the global circuit routing to improve the critical area estimate metric or metrics of one or more tiles that are used by the particular embodiment. For example, the global routing of the circuit is able to be modified to reduce the total conductive trace perimeter or the total conductive trace linear length that is present in some tiles. In one embodiment, adjusting the global circuit routing is able to be performed by re-distributing respective total perimeter lengths of circuit traces among the tiles of the grid. Adjusting of the global circuit routing is also able to include minimizing respective total perimeter lengths of circuit traces within the tiles within the grid. Further embodiments are similarly able to re-distribute or minimize the total linear length of circuit traces in the tiles of the grid. One embodiment, described in detail below, identifies tiles with high critical area estimate metric values and the layout of nets within those identified tiles for the current global circuit routing are modified to reduce the values of the critical area estimate metrics of those identified tiles.

The global routing refinement process 200 determines, at step 212, if the global circuit routing refinement is complete. Any suitable technique for determining completion is able to be used by the various embodiments of the present invention. One embodiment of the present invention bases this determination on values of the estimated critical area estimate metrics of one or more tiles of the grid of tiles 140. For example, one embodiment of the present invention operates to reduce critical area estimate metrics of all tiles to be below a pre-determined value.

If it is determined that the global circuit routing refinement is not complete, the processing returns to determining, at step 208, critical area estimate metrics for each tile in the grid of tiles. If it was determined that the global circuit routing refinement is complete, the global routing refinement process 200 continues by performing, at step 214, detailed circuit routing for the circuit based upon the refined global routing.

The above example describes using critical area estimate metrics for each tile that are one of the total perimeter of the conductive traces within that tile or the total length of conductive traces that are within that tile. Further embodiments of the present invention are able to use one or more other critical area estimate metrics either alone or in combination with other critical area metrics to refine the global routing of a circuit. The critical area estimates performed by one embodiment of the present invention uses the values related the conductive traces for the circuit. Although all metal shapes, such as transistors and other circuit components, are part of a critical area estimation, only the conductive traces are altered by the global routing that is being refined based upon the critical area estimates of one embodiment of the present invention. Various embodiments of the present invention are able to pre-calculate the area of other metal shapes, such as transistors and the like. Further embodiments are also able to exclude the area of metal shapes other than the conductive traces in the parametric comparisons to be performed to refine the global routing of conductive traces.

Examples of other candidate critical area estimate metrics include, but are not limited to, 1) a normalized perimeter of conductive traces within each tile, 2) a density of conductive traces within each tile, 3) a normalized product of the perimeter of conductive traces within each tile and the ratio of perimeter to area of each tile, 4) a normalized P-density for each tile, 5) a ratio of normalized perimeter to area of conductive traces in each tile, 6) a ratio of normalized area to perimeter of conductive traces in each tile, 7) a normalized width of conductive traces in each tile, 8) a normalized W-density within each tile, and 9) a ratio of normalized perimeter to the width of conductive traces in each tile.

In the above candidate critical area estimate metrics, the normalized perimeter is based upon the conductive trace perimeters determined to be contained the each tile of the layout area. The one tile among all of the tiles that has the maximum conductive trace perimeter is identified and its perimeter is defined as "max_perimeter." The one tile among all of the tiles that has a minimum conductive trace perimeter is identified and its conductive trace perimeter is defined as "min_perimeter." The critical area estimate metric "normalized perimeter" for each tile with a respective "perimeter" length is then defined for each tile by the following equation:

$$\text{Normalized Perimeter} = \frac{(\text{perimeter} - \text{min\_perimeter})}{\text{max\_perimeter} - \text{min\_perimeter}}$$

The density of a tile is defined as the ratio of the total area of the conductive traces in a tile, represented as "total_area," and the geometric area of the tile, represented as "tile_area." The critical area estimate metric "density" that is the density of conductive traces within a tile is defined by:

Density=total_area/tile_area.

The critical area estimate metric defined as the normalized product of the perimeter of conductive traces within each tile and the critical area estimate metric based on the ratio of that perimeter to area of conductive traces in each tile is based upon a product of the conductive trace perimeter (represented as "perimeter") within the tile and a ratio of conductive trace perimeter and tile area. This product is represented as P*P/Area and is defined as:

P*P/Area=Perimeter*Perimeter/(Density*tile_area)

The critical area estimate denoted as metric normalized product of the perimeter of conductive traces within each tile and the ratio of that perimeter to area of the tile (identified as "Normalized PPArea" below) is also based on a minimum P*P/Area, represented as "min_PPArea" and maximum P*P/Area, represented as "max_PPArea" as determined for the one tile among all of the tiles that has the minimum P*P/Area value and the one tile with the maximum P*P/Area, respectively. The critical area estimate metric Normalized PPArea is defined for each tile as:

$$\text{Normalized } PPArea = \frac{(PPArea - \text{min\_PPArea})}{\text{max\_PPArea} - \text{min\_PPArea}}$$

The critical area estimate metric normalized P_density is based upon the term "P-density, which is defined as the product of the conductive trace perimeter of each tile and the density of that tile. The normalized P-density is also based on the "min_P_Density as determined for the one tile among all of the tiles with the lowest P_density and the "max_P_density" as determined for the one tile with the highest P_density. The critical area estimate metric normalized P_Density for each tile is defined as:

$$\text{Normalized P\_Density} = \frac{(P\_Density - \text{min\_P\_Density})}{\text{max\_P\_Density} - \text{min\_P\_Density}}$$

The critical area estimate metric referred to as the ratio of normalized perimeter to area of conductive traces for each tile, represented as Normalized Perimeter/Area or Normalized PArea, is based upon a parameter represented as "PArea, which is the ratio of conductive trace perimeter for each tile and the product of the tile density and tile area, i.e.,:

PArea=Perimeter/(Density*tile_area)

The critical area estimate metric Normalized Perimeter/Area is also based on the minimum PArea, represented as "min_PArea" and maximum PArea, represented as "max_PArea" as determined for the tiles with the minimum and maximum PArea, respectively. The critical area estimate metric normalized Perimeter/Area for each tile is defined as:

$$\text{Normalized } PArea = \frac{(PArea - \text{min\_PArea})}{\text{max\_PArea} - \text{min\_PArea}}$$

The critical area estimate metric referred to as the ratio of normalized area to perimeter of conductive traces, or normalized area/perimeter of conductive traces, is based on an "APeri" value defined by the following:

APeri=Density*tile_area/Perimeter

The Normalized area/perimeter critical area estimate metric for each tile is then defined by:

$$\text{Normalized } APeri = \frac{(APeri - \text{min\_APeri})}{\text{max\_APeri} - \text{min\_APeri}}$$

Several critical area estimate metrics are based upon a value defined as "weighted width." A definition of weighted width as is used by one embodiment of the present invention, for example, is defined for a particular tile as:

$$\text{weighted width} = \frac{\sum_{i \in \text{all conductive objects in tile}} (width_i * area_i)}{\text{Total Area of all conductive objects in tile}}$$

As an example of an application of the above equation, the width of each conductive object, e.g., conductive traces, in a particular tile is multiplied by the area of that conductive object. Each of these conductive objects width and area products are then all summed together and divided by the total area of all of the conductive objects in that tile.

The critical area estimate metric referred to as normalized width is based upon the above described weighted width value and is further based upon a minimum weighted width value represented as min_weighted_width and a maximum weighted width value represented as max_weighted_width as determined for the tiles with the largest and smallest weighted width values, respectively. Normalized width of one embodiment is defined as:

$$\text{Normalized Width} = \frac{(\text{weighted width} - \text{min\_weighted\_width})}{\text{max\_weighted\_width} - \text{min\_weighted\_width}}$$

The critical area estimate metric referred to as normalized W-Density is based upon the above described weighted_width value and is also based upon the W-Density value, which is defined by:

$$W\text{-Density} = \text{Weighted\_Width} * \text{Density}$$

The normalized W-Density critical area estimate metric for each tile is further based upon a minimum W-Density value represented as min_W_Density and a maximum W-Density value represented as max_W_Density as determined for the tiles with the largest and smallest W-Density values, respectively. The critical area estimate metric normalized W-Density metric for each tile is defined as:

$$\text{Normalized W\_Density} = \frac{(W\_\text{Density} - \text{min\_W\_Density})}{\text{max\_W\_Density} - \text{min\_W\_Density}}$$

The critical area estimate metric referred to as the ratio of normalized perimeter to the width of conductive traces, identified below as Normalized Perimeter/Width, is based upon a value PWidth defined as the ratio of the conductive trace perimeter and conductive trace width for each tile, i.e., PWidth=Perimeter/Width. The normalized PWidth is based upon a minimum PWidth value represented as min_PWidth and a maximum PWidth value represented as max_PWidth as determined for the tiles with the largest and smallest PWidth values, respectively. The normalized PWidth critical area estimate metric for each tile is defined as:

$$\text{Normalized PWidth} = \frac{(PWidth - \text{min\_PWidth})}{\text{max\_PWidth} - \text{min\_PWidth}}$$

These and other candidate critical area estimate metrics are able to be used by various embodiments of the present invention in estimating critical area estimate metrics for candidate global routings of a circuit in order to support refining that global routing to improve the predicted yield of integrated circuit parts implementing the circuit being analyzed.

Figure 3:
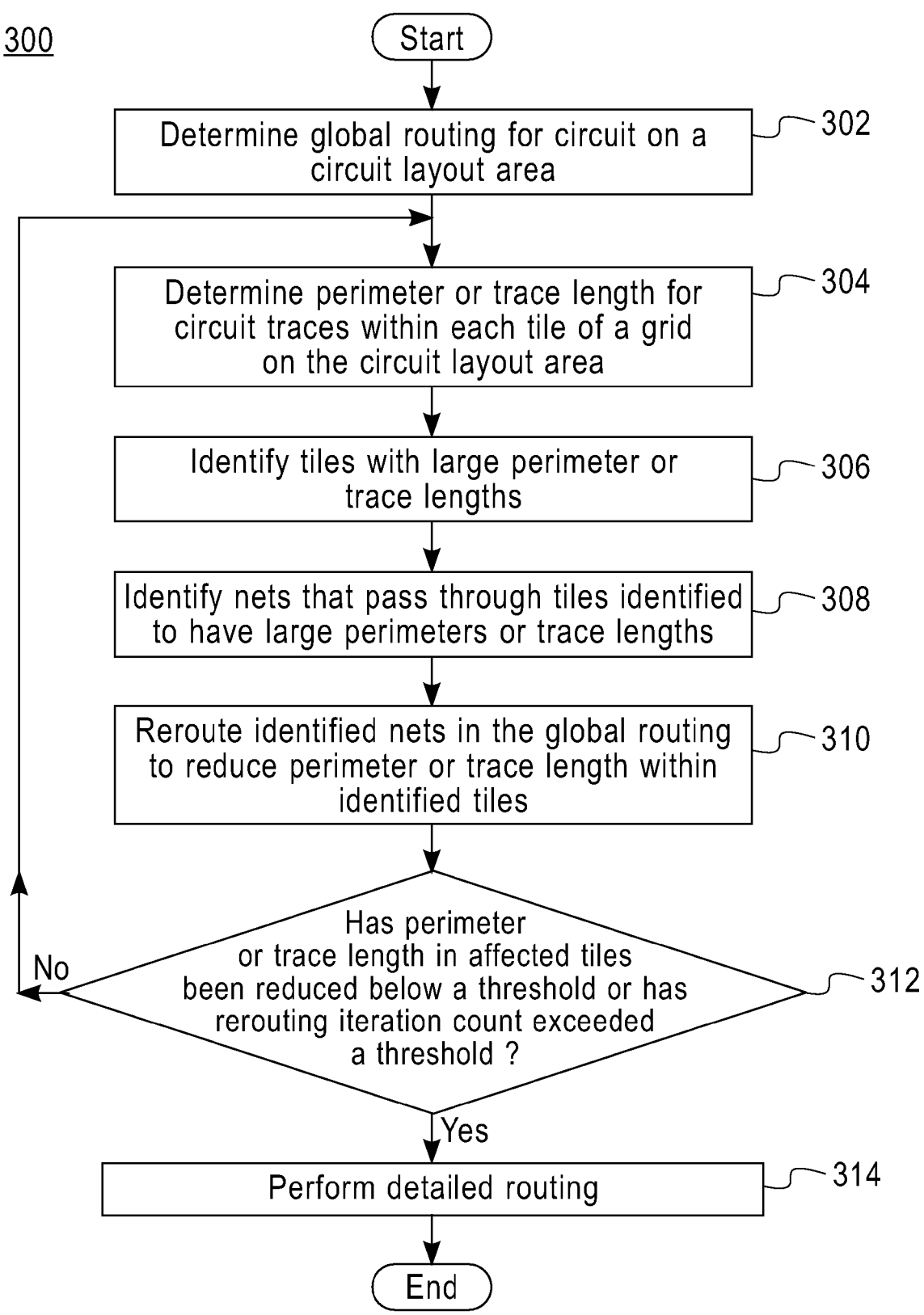
FIG. 3 is a detailed processing flow diagram of a global routing process incorporating estimation of critical area estimate metrics, in accordance with an embodiment of the present invention.

FIG. 3 is a detailed processing flow diagram of a global routing process 300 incorporating estimation of critical area estimate metrics, in accordance with an embodiment of the present invention. The global routing process 300 begins by determining, at step 302, a global routing for a circuit on a circuit layout area. The global routing process 300 continues by determining, at step 304, a perimeter or linear trace length for circuit traces within each tile of a grid of tiles on the circuit layout area based upon the determined global routing. In one embodiment, the perimeter of circuit traces or the linear trace length of circuit traces that are contained within each tile of the grid of tiles is a critical area estimate metric used to refine the global routing of the circuit within the grid of tiles on the circuit layout area. Further embodiments are able to use other critical estimate metrics and determine other values that are associated with those critical area estimate metrics in this step.

The global routing process 300 continues by identifying, at step 306, tiles within the grid of tiles that have a large circuit trace perimeter or a large linear circuit length within that tile. One embodiment makes this determination by examining the critical area estimate metrics that were estimated for each tile. The global routing process 300 continues by identifying, at step 308, nets that pass through the tiles that were identified as having large circuit trace perimeters or linear length of circuit traces. The global routing process 300 continues by rerouting, at step 310, the identified nets in the global routing in order to reduce the conductive trace perimeter or conductive trace linear length with the identified tiles and thereby improving the critical area estimate metric of those identified tiles.

The global routing process 300 continues by determining, at step 312, if the conductive trace perimeter or conductive trace linear length in the tiles affected by the above rerouting has been reduced below a threshold or has a rerouting iteration count exceeded a threshold. One embodiment of the present invention examines the critical analysis estimation metrics to determine if the conductive trace perimeter or conductive trace linear length in the tiles affected by the above rerouting has been reduced below the threshold. If this determination is negative, the processing returns to determining, at step 304, the perimeter or trace length for circuit traces within each tile of a grid on the circuit layout area by calculating the associated critical area estimate metric used by the particular embodiment. If this determination is negative, the global routing process 300 continues by performing, at step 314, detailed routing for the circuit on the circuit layout area.

Generalized Architecture for a Computer System

Figure 4:
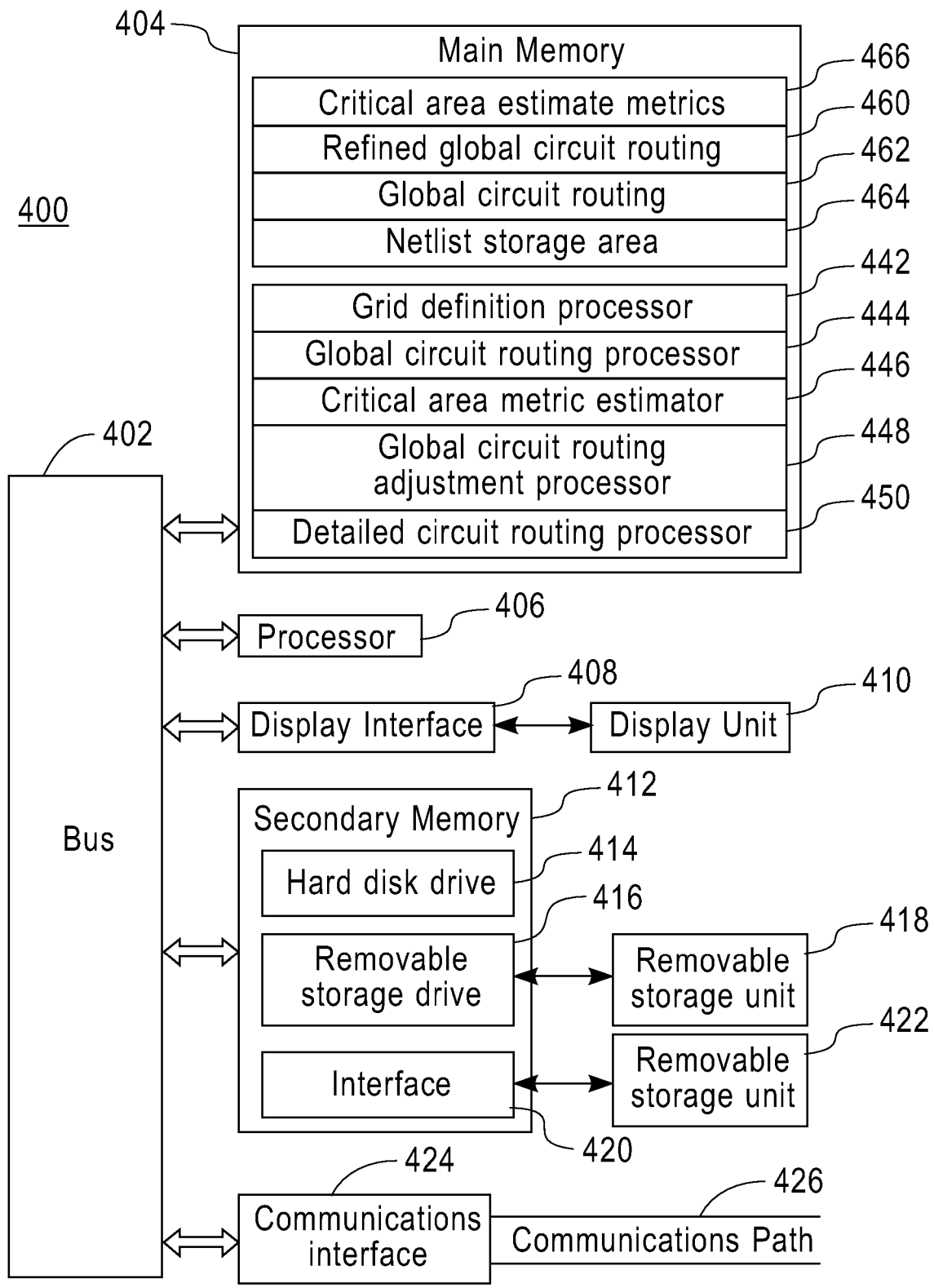
FIG. 4 is a block diagram of a computer system useful for implementing one embodiment of the present invention.

FIG. 4 is a block diagram of a computer system 400 useful for implementing an embodiment of the present invention. The computer system includes one or more processors, such as processor 406, that is able to be programmed to execute machine executable programs. The processor 406 is connected to a communication bus 402 (e.g., a computer backplane interface bus, cross-over bar, or data network). Various software embodiments are able to be realized through the use of the computer system 400. After reading this description, it will become apparent to a person of ordinary skill in the relevant art(s) how to implement the invention using other computer systems and/or computer architectures.

The computer system 400 also includes a main memory 404 that is used to store machine executable programs that are to be executed by processor 404 and to store data used by or produced by processor 404. Main memory 404 is able to include random access memory (RAM) to support reprogramming and flexible data storage. Main memory 404 includes data objects such as a global circuit routing 462 and a refined global circuit routing 460. The global circuit routing 462 and the refined global circuit routing 460 store global circuit routing definitions and adjusted global circuit routing definition as are used and created by the above described processing. The main memory 404 further includes a netlist storage area 464. The netlist storage area 464 stores a netlist that defines a circuit for which an adjusted global circuit routing is to be determined. The netlist stored in the netlist storage area 464 is able to be defined by any suitable mechanism, such as, for example, by manual entry or the use of a computer aided design system. The main memory 404 also includes a critical area estimate metric storage 466. The critical area estimate metric storage stores critical area estimate metrics as calculated by the above described processing.

The main memory 404 further includes executable programs that are executed by processor 406. Executable programs stored in main memory 404 include a grid definition processor program 442 that defines a grid of equally sized tiles on a circuit layout area where each tile of the grid has a respective associated critical area estimate metric. The main memory 404 also includes a global circuit routing processor program 444 that performs a global circuit routing for the circuit that is to be placed within a plurality of tiles of the grid. The main memory 404 also includes a critical area metric estimator program 446 adapted to perform, prior to determining a detailed circuit routing for the circuit, a critical area metric estimate to determine critical area estimate metrics assigned to respective tiles of the grid. The main memory 404 also includes a global circuit routing adjustment processor program 448 that produces a critical area adjusted global circuit routing by adjusting the global circuit routing, after the critical area metric estimator estimates the critical area estimate metrics, in order to improve a respective critical area estimate metric assigned to at least one tile of the grid. The main memory 404 also includes a detailed circuit routing processor program 450 that accepts the global circuit routing that had been adjusted by the global circuit routing adjustment processor 448 and performs a detailed circuit routing for the circuit.

One computer system 400 includes a display interface 408 that forwards graphics, text, and other data from the communication bus 402 (or from a frame buffer not shown) for display on the display unit 410. The computer system also includes a secondary memory 412. The secondary memory 412 may include, for example, a hard disk drive 414 and/or a removable storage drive 416, representing a floppy disk drive, a magnetic tape drive, an optical disk drive, etc. A removable storage drive 416 reads and writes to a removable storage unit 418, such as a floppy disk, magnetic tape, optical disk, etc., that stores computer software and/or data.

In alternative embodiments, the secondary memory 412 may include other similar mechanisms for allowing computer programs or other instructions to be loaded into the computer system. Such mechanisms may include, for example, a removable storage unit 422 adapted to exchange data through an interface 420. Examples of such mechanisms include a program cartridge and cartridge interface (such as that found in video game devices), a removable memory chip (such as an EPROM, or PROM) and associated socket, and other removable storage units 422 and interfaces 420 which allow software and data to be transferred from the removable storage unit 422 to the computer system.

The computer system 400 is also able to include a communications interface 424. Communications interface 424 acts as both an input and an output to allow software and data to be transferred between the computer system and external devices. Examples of a communications interface 424 include a modem, a network interface (such as an Ethernet card), a communications port, a PCMCIA slot and card, etc. Software and data transferred via communications interface 424 are in the form of signals which may be, for example, electronic, electromagnetic, optical, or other signals capable of being received by communications interface 424. These signals are provided to communications interface 424 via a communications path (i.e., channel) 426. This channel 426 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 404 and secondary memory 412, removable storage drive 416, a hard disk installed in hard disk drive 414, and signals. These computer program products are means for providing software to the computer system. The computer readable medium allows the computer system to read data, instructions, messages or message packets, and other computer readable information from the computer readable medium. The computer readable medium, for example, may include non-volatile memory, such as Floppy, ROM, Flash memory, Disk drive memory, CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network, that allow a computer to read such computer readable information.

Computer programs (also called computer control logic) are stored in main memory 404 and/or secondary memory 412. Computer programs may also be received via communications interface 424. Such computer programs, when executed, enable the computer system to perform the features of the present invention as discussed herein. In particular, the computer programs, when executed, enable the processor 406 to perform the features of the computer system. Accordingly, such computer programs represent controllers of the computer system.

As has now been described, embodiments of the present invention facilitate the maintenance of script libraries by presenting an inventive methodology of extracting common sub-procedures from an existing script library and employing the common sub-procedures in a semi-automated process for updating the script library when the application being tested undergoes changes to its GUI structure.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. A method for determining a circuit layout, the method comprising:

defining, by a processor, a grid of tiles on a circuit layout area, each tile of the grid having a respective associated critical area estimate metric;

performing, by the processor, a global circuit routing for a circuit to be placed within a plurality of tiles of the grid;

estimating, by the processor, for at least one tile of the grid, prior to determining a detailed circuit routing for the circuit, a respective critical area estimate metric that is based upon at least one linear measurement of conductive traces within each of the at least one tile;

adjusting, by the processor, the global circuit routing, after estimating the critical area estimate metrics and prior to determining the detailed circuit routing for the circuit, to improve a selected respective critical area estimate metric assigned to at least one tile of the grid to create an adjusted global circuit routing; and producing, by the processor, an adjusted global circuit routing.

2. The method of claim 1, wherein each tile of the grid has a uniform area.

3. The method of claim 1, further comprising determining, by the processor after the adjusting, the detailed circuit routing for the circuit.

4. The method of claim 1, wherein the respective critical area estimate metrics of each of the at least one tile comprise a respective total perimeter length of circuit traces that are within the respective tile, the respective total perimeter length for each tile comprising a total of lengths of all circuit trace sides within the respective tile.

5. The method of claim 4, wherein the adjusting the global circuit routing re-distributes respective total perimeter lengths of circuit traces among a plurality of tiles within the grid.

6. The method of claim 4, wherein the adjusting the global circuit routing minimizes respective total perimeter lengths of circuit traces within a plurality of tiles within the grid.

7. The method of claim 1, wherein the respective critical area estimate metric of each respective tile comprises a total linear length of circuit traces that are within the respective tile.

8. The method of claim 7, wherein the adjusting the global circuit routing re-distributes respective total linear length of circuit traces among a plurality of tiles within the grid.

9. The method of claim 7, wherein the adjusting the global circuit routing minimizes respective total linear lengths of circuit traces within a plurality of tiles within the grid.

10. The method of claim 1, further comprising iteratively estimating, by the processor, the critical area estimate metric and adjusting the global circuit routing.

11. The method of claim 10, wherein the iteratively estimating the critical area estimate metric and adjusting the global circuit routing is performed until at least one critical area estimate metric for each tile within the grid is determined to be below a threshold.

12. The method of claim 10, wherein the iteratively performing the estimating of the critical area metric and adjusting the global circuit routing is performed until at least one critical area estimate metric for each tile within the grid is determined to be one of below a threshold and to have decreased from a previous iteration by less than a predefined amount.

13. The method of claim 1, the critical area estimate metric comprising at least one of:
 a normalized perimeter of conductive traces within each tile,
 a density of conductive traces within each tile,
 a normalized product of the perimeter of conductive traces within each tile and the ratio of perimeter to area of each tile,
 a normalized P-density for each tile,
 a ratio of normalized perimeter to area of conductive traces in each tile,
 a ratio of normalized area to perimeter of conductive traces in each tile,
 a normalized width of conductive traces in each tile,
 a normalized W-density within each tile, and
 a ratio of normalized perimeter to the width of conductive traces in each tile.

14. A circuit layout definition system, comprising:
 a netlist storage area adapted to store at least one netlist of a circuit;
 a grid definition processor adapted to define a grid of tiles on a circuit layout area, each tile of the grid having a respective associated critical area estimate metric;
 a global circuit routing processor adapted to perform a global circuit routing for the circuit, the circuit to be placed within a plurality of tiles of the grid;
 a critical area metric estimator adapted to estimate for at least one tile of the grid, prior to a determining of a detailed circuit routing for the circuit, a respective critical area estimate metric that is based upon at least one linear measurement of conductive traces within each of the at least one tile; and
 a global circuit routing adjustment processor adapted to produce a critical area adjusted global circuit routing by adjusting the global circuit routing, after estimating the critical area estimate metrics and prior to determining the detailed circuit routing for the circuit, to improve a selected respective critical area estimate metric assigned to at least one tile of the grid.

15. The circuit layout definition system of claim 14, wherein each tile of the grid has a uniform area.

16. The circuit layout definition system of claim 14, further comprising a detailed circuit routing processor, communicatively coupled to the global circuit routing adjustment processor, adapted to accept the critical area adjusted global circuit routing and to perform detailed circuit routing for the circuit.

17. The circuit layout definition system of claim 14, wherein respective critical area estimate metrics of each of the at least one tile comprise a respective total perimeter length of circuit traces that are within the respective tile, the respective total perimeter length for each tile comprising a total of lengths of all circuit trace sides within the respective tile.

18. The circuit layout definition system of claim 17, wherein the global circuit routing adjustment processor operates to re-distribute respective total perimeter lengths of circuit traces among a plurality of tiles within the grid.

19. The circuit layout definition system of claim 17, wherein the global circuit routing adjustment processor operates to minimize respective total perimeter length of circuit traces within a plurality of tiles within the grid.

20. The circuit layout definition system of claim 14, wherein the respective critical area estimate metric of each respective tile comprises a total linear length of circuit traces that are within the respective tile.

21. The circuit layout definition system of claim 20, wherein the adjusting the global circuit routing adjustment processor operates to re-distribute respective total linear length of circuit traces among a plurality of tiles within the grid.

22. The circuit layout definition system of claim 20, wherein the adjusting the global circuit routing adjustment processor operates to minimize respective total linear length of circuit traces within a plurality of tiles within the grid.

23. The circuit layout definition system of claim 14, wherein the critical area metric estimator and the global circuit routing adjustment processor operate to iteratively estimate the critical area estimate metric and adjust the global circuit routing.

24. The circuit layout definition system of claim 23, wherein the critical area metric estimator and the global circuit routing adjustment processor iteratively operate to estimate the critical area estimate metric and adjust the global circuit routing until at least one critical area estimate metric for each tile within the grid is determined to be one of below a threshold and to have decreased from a previous iteration by less than a predefined amount.

25. A circuit design system, comprising:
a schematic capture program adapted to define a schematic diagram and to generate at least one netlist for a circuit;
a netlist storage area adapted to store at least one netlist of a circuit;
a grid definition processor adapted to define a grid of tiles on a circuit layout area, each tile of the grid having a respective associated critical area estimate metric;
a global circuit routing processor adapted to perform a global circuit routing for the circuit, the circuit to be placed within a plurality of tiles of the grid;
a critical area metric estimator adapted to estimate for at least one tile of the grid, prior to a determining of a detailed circuit routing for the circuit, a respective critical area estimate metric that is based upon at least one linear measurement of conductive traces within each of the at least one tile; and
a global circuit routing adjustment processor adapted to produce a critical area adjusted global circuit routing by adjusting the global circuit routing, after estimating the critical area estimate metrics and prior to determining the detailed circuit routing for the circuit, to improve a selected respective critical area estimate metric assigned to at least one tile of the grid.

26. A computer program product for creating a system configuration data set, the computer program product comprising:
a storage medium readable by a processing circuit and storing instructions for execution by the processing circuit for performing a method comprising:
defining a grid of tiles on a circuit layout area, each tile of the grid having a respective associated critical area estimate metric;
performing a global circuit routing for a circuit to be placed within a plurality of tiles of the grid;
estimating for at least one tile of the grid, prior to determining a detailed circuit routing for the circuit, a respective critical area estimate metric that is based upon at least one linear measurement of conductive traces within each of the at least one tile;
adjusting the global circuit routing, after estimating the critical area estimate metrics and prior to determining the detailed circuit routing for the circuit, to improve a selected respective critical area estimate metric assigned to at least one tile of the grid to create an adjusted global circuit routing; and
producing an adjusted global circuit routing.

27. The computer program product according to claim 26, the method further comprising determining, after the adjusting, the detailed circuit routing for the circuit.

28. The computer program product according to claim 26, wherein the respective critical area estimate metrics of each of the at least one tile comprise a respective total perimeter length of circuit traces that are within the respective tile, the respective total perimeter length for each tile comprising a total of lengths of all circuit trace sides within the respective tile.

29. The computer program product according to claim 28, wherein the adjusting the global circuit routing minimizes respective total perimeter lengths of circuit traces within a plurality of tiles within the grid.

30. The computer program product according to claim 26, wherein the respective critical area estimate metric of each respective tile comprises a total linear length of circuit traces that are within the respective tile.

31. The computer program product according to claim 30, wherein the adjusting the global circuit routing re-distributes respective total linear length of circuit traces among a plurality of tiles within the grid.

32. The computer program product according to claim 30, wherein the adjusting the global circuit routing minimizes respective total linear lengths of circuit traces within a plurality of tiles within the grid.

33. The computer program product according to claim 26, further comprising iteratively estimating the critical area estimate metric and adjusting the global circuit routing.

34. The computer program product according to claim 33, wherein the iteratively estimating the critical area estimate metric and adjusting the global circuit routing is performed until at least one critical area estimate metric for each tile within the grid is determined to be below a threshold.

* * * * *